United States Patent [19]

Fitzpatrick

[11] Patent Number: 5,394,422
[45] Date of Patent: Feb. 28, 1995

[54] MATERIALS FOR II-VI LASERS

[75] Inventor: Brian J. Fitzpatrick, Ossining, N.Y.

[73] Assignee: North America Philips Corporation, New York, N.Y.

[21] Appl. No.: 121,654

[22] Filed: Sep. 14, 1993

Related U.S. Application Data

[63] Continuation of Ser. No. 815,686, Dec. 31, 1991, Pat. No. 5,260,958.

[51] Int. Cl.$^6$ .............................. H01S 3/19
[52] U.S. Cl. ......................... 372/45; 257/103; 257/13; 257/79
[58] Field of Search ............... 372/45; 257/103, 13, 257/79, 12, 22

[56] References Cited

U.S. PATENT DOCUMENTS 4,549,195  10/1985  Bluzer .................. 357/30

FOREIGN PATENT DOCUMENTS 52-15163  12/1977  Japan.
56-96885  8/1981  Japan.

OTHER PUBLICATIONS

"Photoluminescence in ZnSe Grown by Liquid-Phase Epitaxy from Zn-Ga Solution" S. Fujita et al., J. Appl. Phys 50(2) Feb. 1979.
"Electron Beam Pumped Laser Emission from ZnSxSe1-X" J. R. Onstott, IEEE Journal of Quantum Electronics, Mar. 1977.
"Luminescence Properties of MgZn1-XSe Prepared by Mg Diffusion", Journal of Electronic Materials, vol. 12, No. 4, 1983 no month for reference.
"Energy Bandgap and Lattice Constant Contours of II-VI Quanternary Alloys" T. Ido et al., J. of Electronic Mat. L9(5), 1980, pp. 869-883 no month for reference.

*Primary Examiner*—Georgia Y. Epps
*Attorney, Agent, or Firm*—Norman N. Spain

[57] ABSTRACT

A material for use in a laser heterostructure which is lattice matched material to ZnSe and has a high band gap. The material is $Mg_y Zn_{1-y} S_x Se_{1-x}$ with the ratio of sulphur to magnesium of 0.26/0.19. Lasing devices constructed from layers of this material and ZnSe can be either electron beam pumped or electrically driven.

21 Claims, 1 Drawing Sheet

MATERIALS FOR II-VI LASERS

This is a continuation of application Ser. No. 07/815,686, filed Dec. 31, 1991, now U.S. Pat. No. 5,260,958.

BACKGROUND OF THE INVENTION

This invention relates to materials suitable for use in II-VI laser devices. Specifically, this invention is directed to a material for use in II-VI heterostructures and particularly heterostructures including zinc selenide.

In semiconductor laser technology, heterostructures are employed in order to reduce the threshold current for laser operation. These "heterostructures" are composed of materials of different band gaps ($E_g$) which are arranged in a layer structure. It is very desirable to have the lattice constant of all the materials in the heterostructure identical, i.e., there should be no "lattice mismatch" at the interfaces. Lattice mismatch causes strain and misfit dislocations, and makes good epitaxial growth difficult. Certain III-V materials, used for lasers generating infrared and/or red light, such as gallium arsenide (GaAs) and gallium aluminum arsenide (GaAlAs) are inherently lattice matched so that lasers constructed from heterostructures of these two materials are relatively easy to manufacture.

Another desirable property of materials for heterostructures is chemical similarity, i.e., they should be made of elements from the same groups of the periodic table. This dramatically reduces any problems of cross-contamination between the layers, and improves the quality of epitaxial growth as well.

In the case of high band gap ($E_g > 2.6$ ev) compounds, heterojunctions are usually made with elements from the right side of the periodic table. For example, ZnSe growth on $ZnS_{0.2}Se_{0.8}$ is typical. Such materials are used to construct highly desirable blue generating devices. However, since the addition of sulfur (a smaller atom than selenium) reduces the lattice constant of ZnSe in the alloy crystal $ZnS_{0.2}Se_{0.8}$ lattice mismatch occurs. In fact, there is no composition of $ZnS_xSe_{1-x}$ for which lattice matching can occur. A larger atom, such as Te, could be added, but this reduces the band gap and thus offsets the advantage of adding it to some extent. The compound $ZnS_xSe_yTe_z$, where $x+y+z=1$, would be useful for thin heterostructure layers ($\simeq$1um), but the thick material needed for substrates should have a higher band gap than is attainable with this compound. A similar result would be achieved by the substitution of Cd or Hg for Zn. Thus there is a need for the substitution of an element in $ZnS_xSe_{1-x}$, which will increase both the band gap and the lattice constant.

SUMMARY OF THE INVENTION

It is generally true that the lattice constant of a compound depends on the radius of its constituent elements. The tabulated ionic radius of zinc is 0.70–0.74 Å and that of magnesium is 0.66 Å. Accordingly, the addition of magnesium to ZnSSe would be expected to increase rather than decrease the lattice mismatch. However, the ionic radius of magnesium is determined from compounds where magnesium is present in an octahedral environment. In Zn II-VI compounds, Mg is present in a tetrahedral environment, and its ionic radius is larger. Thus, the substitution of magnesium in Zn II=VI compounds raises the lattice constant. In addition, Mg substitution raises the band gap. This is so because MgSe has a very high band gap, estimated to be about 5.4 ev at room temperature. (This value is estimated from the 77° K. value of 5.6 ev by assuming the change to room temperature is about the same as in the case of other II-VI compounds) Thus a material of very high band gap can be made which matches the lattice constant perfectly. This material has the general formula:

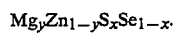

$$Mg_yZn_{1-y}S_xSe_{1-x}.$$

It has been found that the lattice constant of such a material can be made to match the lattice constant of ZnSe to 1 part in 2800, while having a band gap of approximately 3.0 ev. Accordingly, II-VI lasers which are either directly electrically driven or electron beam pumped may be manufactured from heterostructure pairs of ZnSe and MgZnSSe. Such structures will be lattice matched, unlike those of ZnSe/ZnSSe and will have a higher difference in band gap between the two components of the heterostructure pair.

BRIEF DESCRIPTION OF THE DRAWINGS

For a fuller understanding of the invention, reference is made to the following description taken in connection with the accompanying drawings of the preferred embodiments, in which.

DESCRIPTION OF THE PREFERRED EMBODIMENTS

This invention is directed to a compound suitable for use in II-VI laser devices and particularly laser devices of zinc selenide. The compound will provide lattice matching with ZnSe. The material has the general formula:

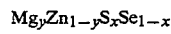

$$Mg_yZn_{1-y}S_xSe_{1-x}$$

Heterostructures may be manufactured with alternating layers of ZnSe and $Mg_y Zn_{1-y} S_x Se_{1-x}$ rather than alternating layers of ZnSe and ZnSSe. Heterostructures need only relatively dilute quantities of Mg to provide suitable devices. For example:

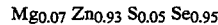

$$Mg_{0.07} Zn_{0.93} S_{0.05} Se_{0.95}$$

is suitable for lasing heterostructures in combination with layers of ZnSe.

The lattice constant and band gap of specific compositions can be calculated as follows:

| | |
|---|---|
| $a_o$ of ZnSe (cubic) | 5.67 Å |
| $a_o$ of ZnS (cubic) | 5.41 |
| $\Delta a_o$ between ZnSe & ZnS | 0.26 |

MgSe is generally not available in pure form with the same crystal structure as ZnSe. However, at small values of y (dilute solutions), it has been shown to incorporate into the structure of the dominant ZnSe. The $a_o$ (lattice constant) of MgSe (cubic) can be calculated from the hexagonal lattice constant by multiplying it by $\sqrt{2}$. This gives a value of 5.86 Å.

As before

| | |
|---|---|
| $a_o$ of MgSe (cubic) | 5.86 Å |
| $a_o$ of ZnSe (cubic) | 5.67 |
| $\Delta a_o$ between ZnSe & MgSe | 0.19 |

These values of the difference in lattice constants allow us to calculate the effect of small additions of sulfur or magnesium to the ZnSe lattice. In fact, any addition of sulfur (which decreases the lattice constant) can be exactly compensated by additions of magnesium (which increases it), using the ratio 0.26/0.19 or 1.37, the ratio of the $\Delta a_o$'s. As an example, if 5% sulfur is added, 7% magnesium must be added to compensate. This leads to a composition $$Mg_{0.07}Zn_{0.93}S_{0.05}Se_{0.95}$$

The band gap ($E_g$) of this composition can be calculated as follows. This difference in band gap between ZnS and ZnSe is

| | |
|---|---|
| 3.66 | ev ($E_g$ of cubic ZnS) |
| 2.67 | ($E_g$ of ZnSe) |
| 0.99 | ev |

The increase in $E_g$ due to the mixing of ZnS and ZnSe is proportional to the amount of ZnS. Thus for 5% ZnS, $$\Delta E_g = (0.05)(0.99) = 0.05 \text{ ev.}$$

For mixing MgSe with ZnSe:

| | |
|---|---|
| 5.4 | ev ($E_g$ of MgSe at room temp.) |
| 2.67 | ($E_g$ of ZnSe) |
| 2.73 | ev |

For 7% MgSe, $$\Delta E_b = (0.07)(2.73) = 0.19 \text{ ev}$$

These two values should be added to the $E_g$ of ZnSe to get an estimate of the final value of $E_g$ for the composition of this example.

$$E_g = 2.67 + 0.19 + 0.05 = 2.91 \text{ ev.}$$

Figure 1:
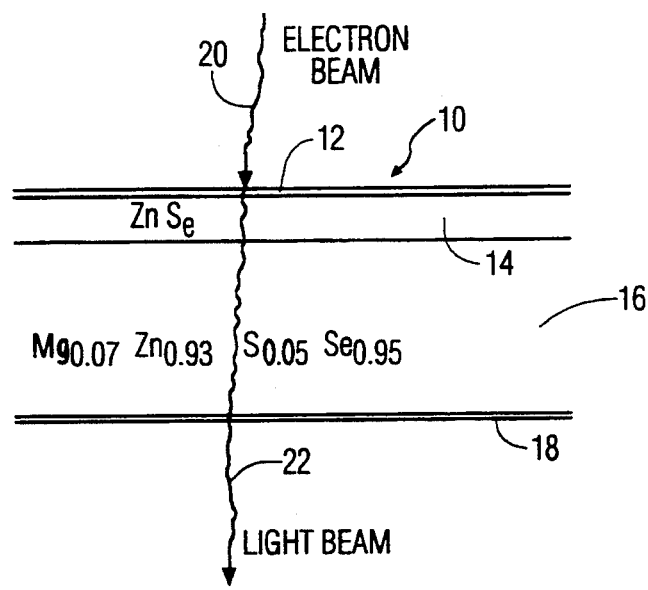
FIG. 1 is a sectional illustration of an electron beam pumped laser constructed in accordance with the present invention.

Some examples of heterostructure laser devices are as follows: FIG. 1 illustrates a simple heterostructure laser 10 which is pumped by means of an electron beam. Laser 10 has a 100 percent reflecting mirror 12 at its upper surface with a layer 14 of ZnSe of approximately 5 μm. Under layer 14 is a relatively thick (100 μm) layer 16 of $Mg_{0.07}Zn_{0.93}S_{0.05}Se_{0.95}$ and a lower layer 18 which is a 90 percent reflecting mirror. Upon pumping by an electron beam 20 impinging upon upper mirror 12, lasing will occur such that a light beam 22 will emerge from partially reflective lower mirror 18.

Figure 2:
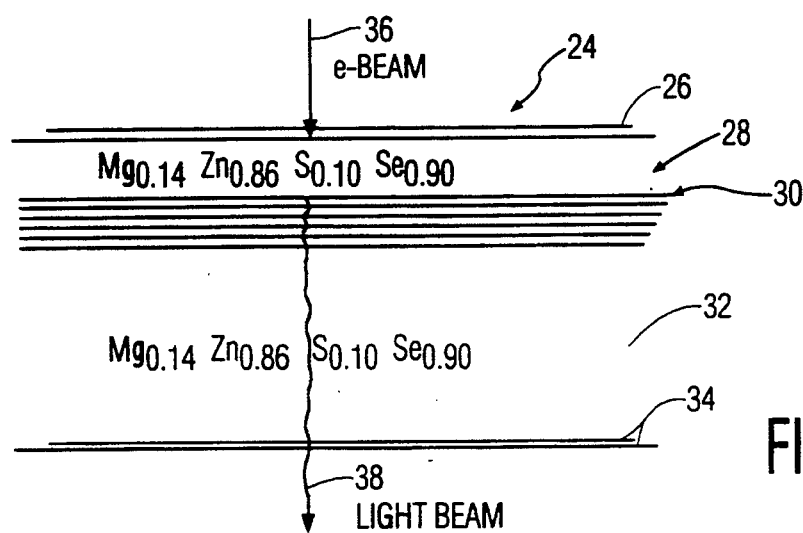
FIG. 2 is a sectional illustration of an electron beam pumped laser having multiple heterostructures constructed in accordance with the present invention.

FIG. 2 illustrates a multiple heterostructure laser 24 having multiple quantum wells. Laser 24 includes an upper 100 percent reflecting mirror 26 which is disposed above a relatively thick cladding layer 28 of $Mg_{0.14}Zn_{0.86}S_{0.1}Se_{0.9}$. Disposed beneath layer 28 is a heterostructure 30 comprised of alternating layers of ZnSe and $Mg_{0.07}Zn_{0.93}S_{0.05}Se_{0.95}$. Beneath heterostructure 30 is a relatively thick substrate 32 of $Mg_{0.14}Zn_{0.86}S_{0.1}Se_{0.9}$ and a partially reflective mirror 34. Electron beam 36 will cause a lasing effect within the various layers and a light beam 38 will exit through the partially reflective mirror 34.

Figure 3:
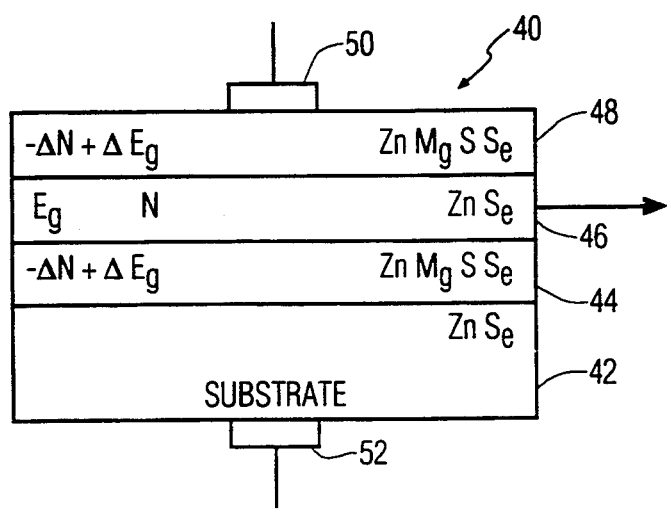
FIG. 3 is a sectional illustration of an electrically driven laser constructed in accordance with the present invention.

Fabrication and doping techniques have evolved so that it is now possible to manufacture both p and n-type ZnSe. Thus, electrically driven semiconductor lasing devices are now possible. An electrically driven laser utilizing MgZnSSe in accordance with the present invention is also possible. FIG. 3 illustrates an electrically pumped laser structure 40 which is comprised of a substrate 42 of ZnSe and a heterostructure of a first layer 44 of $Mg_yZn_{1-y}S_xSe_{1-x}$ upon which is deposited a layer 46 of ZnSe and an upper layer 48 of $Mg_yZn_{1-y}S_xSe_{1-x}$. Layers 48 and 44 have a smaller index of refraction and a larger Eg than layer 46 which provides an optical confinement for generated light and hole and electron injection. Ohmic contacts 50, 52 are connected to a source of electrical potential (not shown) for providing the driving energy. The number of layers in the heterostructure may be varied to suit the particular needs of the device and application. Similarly, the percentage of magnesium is adjusted in accordance with the above-noted formula and with needs of the application and devices take into account.

The above described arrangement is merely illustrative of the principles of the present invention. Numerous modifications and adaptations thereof will be readily apparent to those skilled in the art without departing from the spirit of scope of the present invention and the appended claims.

What is claimed is:

1. A light emitting device comprising at least one layer of ZnSe and at least one layer of $Mg_y Zn_{1-y} S_x Se_{1-x}$ wherein y=0.07–0.14 and wherein the ratio of y to x is 26/19.

2. The device as claimed in claim 1 wherein the amount of magnesium is 7 percent and the amount of sulphur is 5 percent.

3. The device as claimed in claim 1 wherein the structure comprises multiple layers.

4. The device as claimed in claim 1 wherein the amount of magnesium is 14 percent.

5. The device as claimed in claim 1 wherein said layers are disposed on a substrate.

6. The structure as claimed in claim 1 further including at least one partially reflecting mirror and a totally reflecting mirror.

7. In a device having a light emitting layer of ZnSe the improvement comprising at least one layer of $Mg_y Zn_{1-y} S_x Se_{1-x}$ disposed proximate said layer of ZnSe wherein the amount of Mg is between 0.07 and 0.14 and the ratio of y to x is 26/19.

8. The device as claimed in claim 7 wherein said y value is 0.07.

9. The device as claimed in claim 7 wherein a layer of $Mg_y Zn_{1-y} S_x Se_{1-x}$ is disposed on each side of said layer of ZnSe.

10. The device as claimed in claim 9 wherein said layers of $Mg_y Zn_{1-y} S_x Se_{1-x}$ have differing indexes of refraction from said ZnSe layer.

11. The device as claimed in claim 9 wherein said layers of $Mg_y Zn_{1-y} S_x Se_{1-x}$ have different band gaps from said layer of ZnSe.

12. The device as claimed in claim 7 wherein said layers of $Mg_y Zn_{1-y} S_x Se_{1-x}$ and ZnSe are deposited on a substrate.

13. The device as claimed in claim 12 wherein said substrate comprises ZnSe.

14. A light emitting device comprising a light emitting layer of II-VI material and at least one layer of $Mg_y Zn_{1-y} S_x Se_{1-x}$ wherein the ratio of y to x is 26/19 and wherein y=0.07-0.14.

15. The device as claimed in claim 14 wherein the light emitting layer comprises ZnSe.

16. The device as claimed in claim 14 wherein said y value is 0.07.

17. The device as claimed in claim 14 wherein a layer of $Mg_y Zn_{1-y} S_x Se_{1-x}$ is disposed on each side of the light emitting layer.

18. The device as claimed in claim 17 wherein said layers of $Mg_y Zn_{1-y} S_x Se_{1-x}$ have differing indexes of refraction from said light emitting layer.

19. The device as claimed in claim 14 wherein the layers of $Mg_y Zn_{1-y} S_x Se_{1-x}$ have differing band gaps from said light emitting layer.

20. The device as claimed in claim 17 wherein said layers of $Mg_y Zn_{1-y} S_x Se_{1-x}$ and said light emitting layers are disposed on a substrate material.

21. The device as claimed in claim 20 wherein the substrate comprises ZnSe.

* * * * *